United States Patent
Ishikawa et al.

(10) Patent No.: US 10,824,775 B2
(45) Date of Patent: Nov. 3, 2020

(54) SIMULATION METHOD AND DEVICE FOR DETERMINING COLLISION BETWEEN OBJECTS

(71) Applicant: Sony Interactive Entertainment Inc., Tokyo (JP)

(72) Inventors: Hitoshi Ishikawa, Kanagawa (JP); Hiroshi Matsuike, Tokyo (JP); Koichi Yoshida, Tokyo (JP)

(73) Assignee: Sony Interactive Entertainment Inc., Tokyo (JP)

(*) Notice: Subject to any disclaimer, the term of this patent is extended or adjusted under 35 U.S.C. 154(b) by 1020 days.

(21) Appl. No.: 15/101,490

(22) PCT Filed: Apr. 25, 2014

(86) PCT No.: PCT/JP2014/061689
§ 371 (c)(1),
(2) Date: Jun. 3, 2016

(87) PCT Pub. No.: WO2015/093073
PCT Pub. Date: Jun. 25, 2015

(65) Prior Publication Data
US 2016/0378892 A1    Dec. 29, 2016

(30) Foreign Application Priority Data

Dec. 18, 2013  (JP) ................. 2013-261857

(51) Int. Cl.
*G06F 30/20* (2020.01)
*A63F 13/577* (2014.01)
(Continued)

(52) U.S. Cl.
CPC .............. *G06F 30/20* (2020.01); *A63F 13/44* (2014.09); *A63F 13/577* (2014.09);
(Continued)

(58) Field of Classification Search
CPC .... A63F 13/44; A63F 13/577; G06F 17/5009; G06F 30/20; G06T 17/005; G06T 2210/21; G06T 2210/52
See application file for complete search history.

(56) References Cited

U.S. PATENT DOCUMENTS 5,263,124 A * 11/1993 Weaver ............... G06K 9/6282
                                                              382/159
5,943,056 A     8/1999 Sato
(Continued)

FOREIGN PATENT DOCUMENTS

CN   101593366 A   12/2009
CN   102292749 A   12/2011
(Continued)

OTHER PUBLICATIONS

International Preliminary Report on Patentability and Written Opinion for corresponding PCT application No. PCT/JP2014/061689, 12 pages, dated Jun. 30, 2016.
(Continued)

Primary Examiner — Kibrom K Gebresilassie
(74) Attorney, Agent, or Firm — Matthew B. Dernier, Esq.

(57) ABSTRACT

Methods and apparatus provide for, at each of plural calculation timings, associating pieces of position information indicating the positions of objects in a virtual space at the calculation timing with leaves and creates a complete binary tree in which position information reflecting pieces of the position information of child nodes is associated with an internal node, and a node shuffling section that shuffles $2 \cdot 2^n$ ($n \geq 1$) child nodes regarding each group of $2^n$ nodes on the basis of the position information associated with each of the $2 \cdot 2^n$ child nodes belonging to the $2^n$ nodes in each layer sequentially from the immediately-upper layer of the lowermost layer in the complete binary tree; and carrying out
(Continued)

collision determination between objects by using the complete binary tree resulting from the shuffling by the node shuffling section.

7 Claims, 10 Drawing Sheets

(51) Int. Cl.
  *A63F 13/44* (2014.01)
  *G06T 17/00* (2006.01)
(52) U.S. Cl.
  CPC ........ *G06T 17/005* (2013.01); *G06T 2210/21* (2013.01); *G06T 2210/52* (2013.01)

(56) References Cited

U.S. PATENT DOCUMENTS

| | | | | |
|---|---|---|---|---|
| 8,188,996 | B2* | 5/2012 | Dammertz | G06T 15/06 345/419 |
| 8,188,997 | B2* | 5/2012 | Dammertz | G06T 15/06 345/419 |
| 9,020,787 | B2* | 4/2015 | Grinspun | G06F 30/00 703/6 |
| 9,576,393 | B1* | 2/2017 | Bethel | G06T 19/00 |
| 2013/0235050 | A1 | 9/2013 | Karras | |
| 2015/0130795 | A1* | 5/2015 | Chhugani | G06Q 30/0643 345/419 |
| 2015/0169803 | A1* | 6/2015 | Ishikawa | G06F 30/20 703/2 |
| 2015/0169804 | A1* | 6/2015 | Ishikawa | G06F 30/20 703/2 |
| 2016/0293133 | A1* | 10/2016 | Dutt | A63F 13/57 |
| 2016/0378892 | A1* | 12/2016 | Ishikawa | G06T 17/005 703/6 |

FOREIGN PATENT DOCUMENTS

| | | |
|---|---|---|
| CN | 102368280 A | 3/2012 |
| EP | 0789895 A1 | 8/1997 |
| JP | 09027046 A | 12/1997 |
| JP | 2002269588 A | 9/2002 |
| WO | 9613811 A1 | 5/1996 |

OTHER PUBLICATIONS

European Search Report for corresponding EP application No. 14871365.4, 9 pages, dated May 9, 2017.
Chapter 6: "Bounding Volume Hierarchies" In: Christer Ericson: 11 Real-TimeCollision Detection, pp. 1-52, dated Jan. 1, 2005.
Yi-Si Xing et al: "Efficient collision detection based on AABB trees and sort algorithm," Control and Automation (ICCA), 2010 8th IEEE International Conference on, pp. 328-332, Jun. 9, 2010.
Office Action for corresponding CN application No. 201480067196.4, 13 pages, dated Mar. 5, 2018.
International Search Report for corresponding PCT application No. PCT/JP2014/061689, 1 page, dated Jul. 15, 2014.
Chapter 6: "Bounding Volume Hierarchies" In: Christer Ericson: 11 Real-TimeCollision Detection, pp. 235-284, dated Jan. 1, 2005.

\* cited by examiner

| OBJECT PAIR | IDENTIFIER \ STAGE S | STAGE 0 | STAGE 1 | ... |
|---|---|---|---|---|
| (A,B) | A | 1 | 1 | |
| (A,C) | B | 1 | 0 | |
| (D,E) | C | 0 | 1 | ... |
| (B,Z) | D | 1 | 0 | |
| (F,G) | E | 1 | 0 | |
| ⋮ | F | 1 | 0 | |
| | G | 1 | 0 | |
| | ⋮ | ⋮ | ⋮ | |

| TIME COUNTER | t=n | | | | t=n+1 | | |
|---|---|---|---|---|---|---|---|
| STEP | STEP 0 | STEP 1 | STEP 2 | STEP 3 | STEP 4 | STEP 5 | |
| OBJECT | [A] [C] [B] | [A] [C]→[B] | [A]→[C] [B] | [A] [C] [B] | [A] [C]→[B] | [A]→[C]→[B] | |
| ROUTE VALUE | A C B | A B B | A A B | A A B | A A A | A A A | |
| | A C B | A B B | A A B | A C B | A C C | A A C | |
| POINTER VALUE | | | | | | | |

FIG.11B
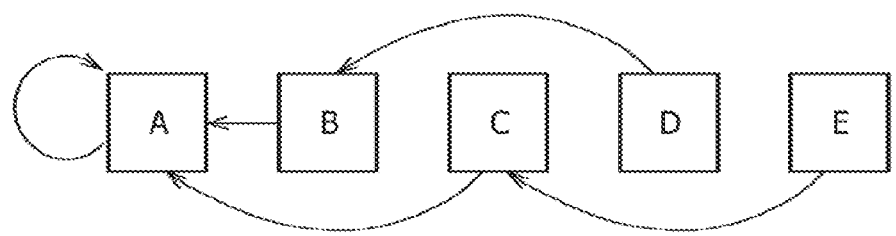
FIG.11C
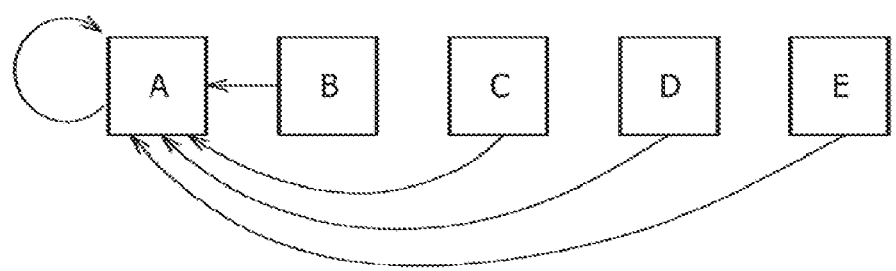
FIG.12
| IDENTIFIER | A | B | C | D | E |
|---|---|---|---|---|---|
| POINTER VALUE (INITIAL VALUE) | A | A | B | C | D |
| POINTER VALUE (ONE TIME OF UPDATE) | A | A | A | B | C |
| POINTER VALUE (TWO TIMES OF UPDATE) | A | A | A | A | A |

SIMULATION METHOD AND DEVICE FOR DETERMINING COLLISION BETWEEN OBJECTS

TECHNICAL FIELD

The present invention relates to a simulation device that carries out a simulation relating to plural objects that move in a virtual space over time, a control method thereof, a program, and an information storage medium.

BACKGROUND ART

In a simulation in which collision determination of plural objects disposed in a virtual space is carried out, the collision determination is carried out on the basis of the positions of two objects on the virtual space. Here, carrying out the collision determination of the plural objects in a round-robin manner is inefficient because the amount of calculation becomes more enormous as the number of objects increases. Thus, conventionally, as one of methods for reducing the number of times of collision determination, collision determination with use of a binary tree reflecting the positional relationship among the plural objects in the virtual space is carried out. By using the binary tree reflecting the positional relationship among the objects, collision determination of objects whose positions in the virtual space are separate from each other can be skipped.

As a method for constructing this binary tree, there is e.g. a method in which processing of defining a region including all objects as a root and defining each of divided regions obtained by bisecting this region as a child node and moreover defining divided regions obtained by bisecting each of the divided regions as grandchild nodes is recursively repeated until divided regions including only one object become leaves.

SUMMARY

Technical Problem

Here, to reduce the processing load accompanying increase in the number of objects in the construction of the binary tree, it is preferable to execute the construction of the binary tree by parallel processing. However, with the conventional method for constructing the binary tree, the numbers of objects included in the divided regions of the respective layers are different and therefore the parallel processing cannot be efficiently executed in some cases.

One of objects of the present invention is to provide a method that is suitable for parallel processing and is for constructing a binary tree reflecting the positions of objects in a virtual space for execution of collision determination of the objects.

Solution to Problem

A simulation device according to the present invention is a simulation device that determines collision between objects at each of a plurality of calculation timings about a plurality of objects that move in a virtual space over time. The simulation device is characterized by including a complete binary tree creating section that, at each of the plurality of calculation timings, associates pieces of position information indicating positions of the objects in the virtual space at the calculation timing with leaves and creates a complete binary tree in which position information reflecting pieces of the position information of child nodes is associated with an internal node, and a node shuffling section that shuffles $2 \cdot 2^n$ ($n \geq 1$) child nodes regarding each group of $2^n$ nodes on a basis of the position information associated with each of the $2 \cdot 2^n$ child nodes belonging to the $2^n$ nodes in each layer sequentially from an immediately-upper layer of a lowermost layer in the complete binary tree. Collision determination between objects is carried out by using the complete binary tree resulting from the shuffling by the node shuffling section.

Furthermore, in the above-described simulation device, the position information indicating the position of the object may be a region in which the object that corresponds is inscribed, and the node shuffling section may shuffle the $2 \cdot 2^n$ child nodes belonging to the $2^n$ nodes into combinations with which the region of a parent node becomes small.

Moreover, in the above-described simulation device, regarding each of a plurality of combination candidates obtained by shuffling the $2 \cdot 2^n$ child nodes, the node shuffling section may randomly change the size of the region of a parent node with the combination candidate, and the node shuffling section may shuffle the $2 \cdot 2^n$ child nodes belonging to the $2^n$ nodes to yield the combination candidate with which the region resulting from the change in the size is small.

In addition, the above-described simulation device may further include a determining section that determines whether or not overlapping is present between the regions of nodes for each pair of two nodes in each layer sequentially from an uppermost layer in the complete binary tree resulting from the shuffling by the node shuffling section.

Furthermore, in the above-described simulation device, the determining section may further determine whether or not overlapping is present between the regions of nodes in all combinations of four child nodes belonging to two nodes about which it is determined that overlapping is present by the determining section in a previous layer.

Moreover, in the above-described simulation device, the complete binary tree creating section may create a complete binary tree by using a correspondence relationship between leaves and objects in a complete binary tree used for collision determination at a previous calculation timing in a case of creating a complete binary tree to be used for collision determination at a second or subsequent calculation timing.

Furthermore, a program according to the present invention is a program for causing a simulation device that determines collision between objects at each of a plurality of determination timings about a plurality of objects that move in a virtual space over time to function as complete binary tree creating means that associates pieces of position information indicating positions of the objects in the virtual space at a certain determination timing with leaves and creates a complete binary tree in which position information reflecting pieces of the position information of child nodes is associated with an internal node, and node shuffling means that shuffles $2 \cdot 2^n$ ($n \geq 1$) child nodes regarding each group of $2^n$ nodes on a basis of the position information associated with each of the $2 \cdot 2^n$ child nodes belonging to the $2^n$ nodes in each layer sequentially from an immediately-upper layer of a lowermost layer in the complete binary tree. This program may be stored in a computer-readable information storage medium.

Moreover, a control method of a simulation device according to the present invention is a control method for controlling a simulation device that determines collision between objects at each of a plurality of determination timings about a plurality of objects that move in a virtual space over time. The control method is characterized by including a complete binary tree creation step of associating pieces of position information indicating positions of the objects in the virtual space at a certain determination timing with leaves and creating a complete binary tree in which position information reflecting pieces of the position information of child nodes is associated with an internal node, and a node shuffling step of shuffling $2 \cdot 2^n$ ($n \geq 1$) child nodes regarding each group of $2^n$ nodes on a basis of the position information associated with each of the $2 \cdot 2^n$ child nodes belonging to the $2^n$ nodes in each layer sequentially from an immediately-upper layer of a lowermost layer in the complete binary tree.

BRIEF DESCRIPTION OF DRAWINGS

FIG. 11B is a diagram schematically depicting one example of the linked objects after update of pointer values of the respective objects about the linked objects depicted in FIG. 11A.

FIG. 11C is a diagram schematically depicting one example of the linked objects after update of the pointer values of the respective objects about the linked objects depicted in FIG. 11B.

FIG. 12 is a diagram depicting the transition of the pointer values of the respective objects depicted in FIG. 11A.

DESCRIPTION OF EMBODIMENT

An embodiment of the present invention will be described in detail below with reference to the drawings.

Figure 1:
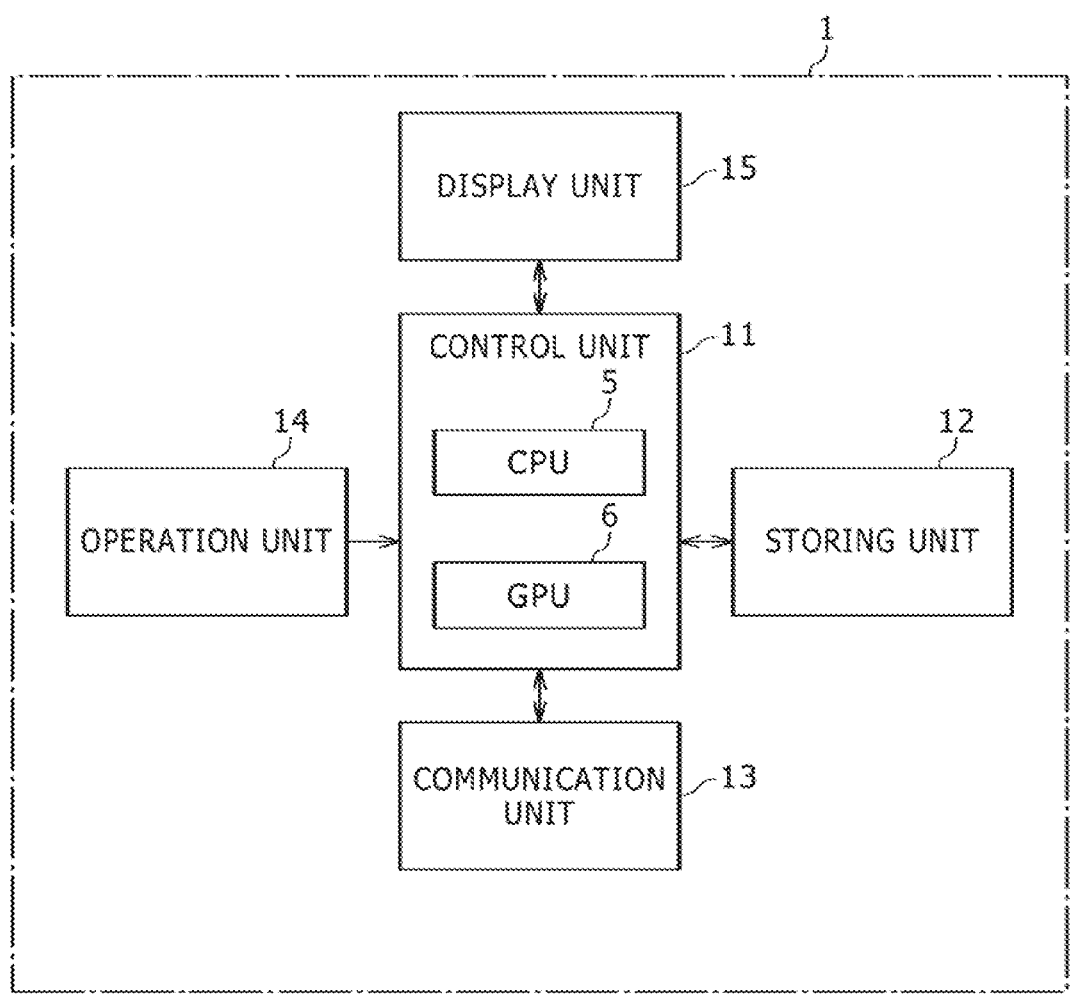
FIG. 1 is a diagram depicting one example of the configuration of a simulation device 1 according to the present embodiment.

FIG. 1 is a diagram depicting one example of the configuration of a simulation device 1 according to the present embodiment. The simulation device 1 according to the present embodiment is e.g. a game machine for home use, a personal computer, or the like and is configured to include a control unit 11, a storing unit 12, a communication unit 13, an operation unit 14, and a display unit 15 as depicted in FIG. 1.

The control unit 11 is configured to include a CPU 5, a GPU 6, and so forth and executes various kinds of information processing in accordance with programs stored in the storing unit 12. A concrete example of the processing executed by the control unit 11 in the present embodiment will be described later.

The storing unit 12 is configured to include memory elements such as a RAM and a ROM, a hard disc drive, and so forth and stores programs to be executed by the control unit 11 and various kinds of data. Furthermore, the storing unit 12 operates also as a work memory for the control unit 11.

The communication unit 13 is a communication interface and receives data that comes from the external via a communication network to output the data to the control unit 11. Furthermore, the communication unit 13 transmits various kinds of data to other information processing devices connected via the communication network in accordance with instructions from the control unit 11.

The operation unit 14 is a keyboard, a mouse, a controller of a game machine for home use, and so forth and accepts operation input of a user to output a signal indicating the contents thereof to the control unit 11.

The display unit 15 is a display device such as a liquid crystal display and displays various kinds of images in accordance with instructions of the control unit 11.

The simulation device 1 may include an optical disc drive that reads optical discs such as a DVD-ROM and a Blu-ray (registered trademark) disc, a universal serial bus (USB) port, and so forth.

A concrete example of functions implemented by the simulation device 1 according to the present embodiment will be described below. In the present embodiment, regarding plural objects that move in a virtual space, the positions of the objects that change over time are calculated by simulation processing such as physical simulation. In the present embodiment, particularly simulation processing with consideration of influence on the positions of the respective objects due to a collision between objects is executed. Suppose that mainly the GPU 6 of the control unit 11 executes this simulation processing. However, the CPU 5 or another device may execute the simulation processing.

The GPU 6 has a larger number of cores than the CPU 5 and also has a larger number of processing units (threads) that can be simultaneously executed, and therefore is suitable for parallel processing. Meanwhile, threads that are simultaneously executed are required to be processing with contents identical to each other. Thus, to efficiently execute the simulation processing by using the GPU 6, the processing needs to be executed with an algorithm different from conventional algorithms.

Suppose that the progression of time in the virtual space is represented by the value of a time counter t. The value of the time counter t is incremented by one and simulation processing is executed every predetermined unit time d. That is, each calculation timing as the subject of calculation of the positions of objects is represented by the time counter $t=0$, 1, 2, 3, . . . . Furthermore, each object is associated with ID information (identifier) set uniquely to the object in order to identify the object. Moreover, attribute information may be associated with each object. As the attribute information, e.g. information representing the kind of object, information that defines the outer shape, and other various kinds of attribute information according to the kind of object may be employed.

Figure 2:
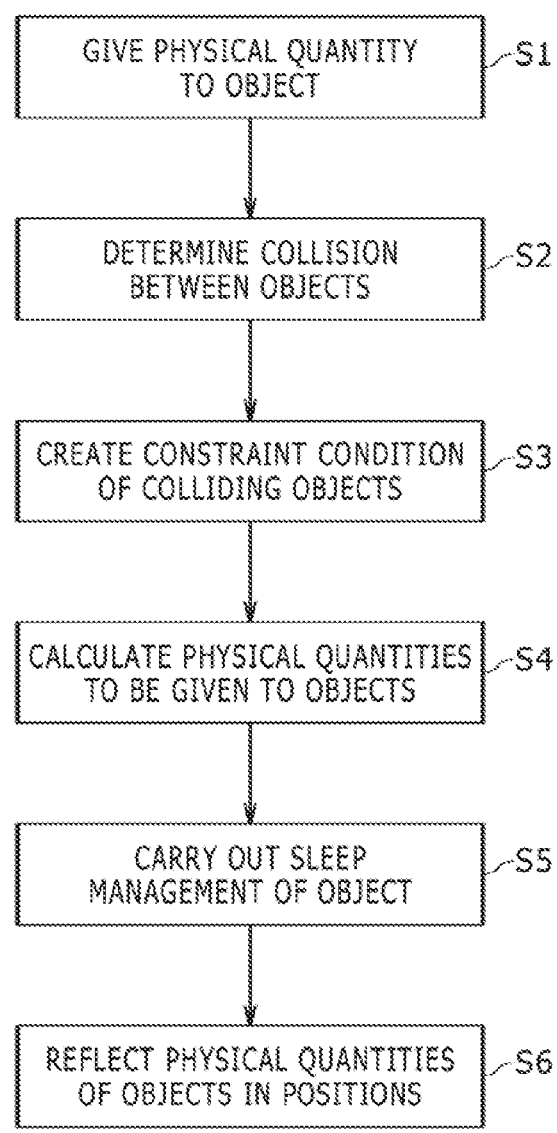
FIG. 2 is a diagram depicting one example of the flow of simulation processing executed by the simulation device 1 in the present embodiment.

Here, one example of the flow of the simulation processing executed by the simulation device 1 in the present embodiment will be described with reference to a flow direction of FIG. 2. The processing depicted in the FIG. 2 is executed every time the value of the time counter t is incremented.

First, a physical quantity (velocity, acceleration, etc.) is given to at least part of the plural objects disposed in the virtual space (S1). Thereby, the positions of the plural objects disposed in the virtual space change over time.

Next, at a calculation timing when the positions of the objects are calculated, collision between the objects is determined (S2). The processing S2 will be described in detail later.

Then, a constraint condition of two objects determined to be colliding with each other by the processing S1 is created (S3). Here, for example, the motion of the objects needs to be constrained so that the positions of the two objects determined to be colliding with each other may be prevented from further changing from the collision point in the traveling direction. Otherwise, e.g. a problem that the colliding objects dig into or pass through each other occurs. In the processing S3, the constraint condition for constraining such motion of the objects is created. Then, by solving the constraint condition, physical quantities to be given to the respective objects in order to satisfy the constraint condition are calculated (S4). The processing S4 will be described in detail later.

At this time, an object whose velocity is almost zero exists among the plural objects that move in the virtual space. For such an object in a substantially stop state, sleep management of setting the velocity to zero to make the object sleep (set the object to the stop state) is carried out (S5). The object in the stop state due to the sleep management is excluded from the calculation target, which reduces the amount of processing of the calculation. Note that when an external force is given to the object in the stop state due to the sleep management, the stop state by the sleep management is released and the object is added to the calculation target. The processing S5 will be described in detail later.

Then, the physical quantities given to the respective objects are reflected in the positions in the virtual space (S6). That is, from the physical quantities given to the respective objects, the positions of the respective objects at the timing when the state of the virtual space is rendered are calculated. Then, the simulation device 1 renders an image depicting the appearance of the virtual space in the state in which the objects are disposed at the calculated positions and outputs the image to the display unit 15. Due to this, every time the unit time d elapses, the image of the virtual space in which the respective objects are disposed at the positions at the timing calculated by the simulation device 1 is displayed on the screen of the display unit 15.

Here, the collision determination processing of the objects by the processing S2, the physical quantity calculation processing of the objects by the processing S4, and the sleep management processing of the objects by the processing S5 will be described in detail below.

Figure 3:
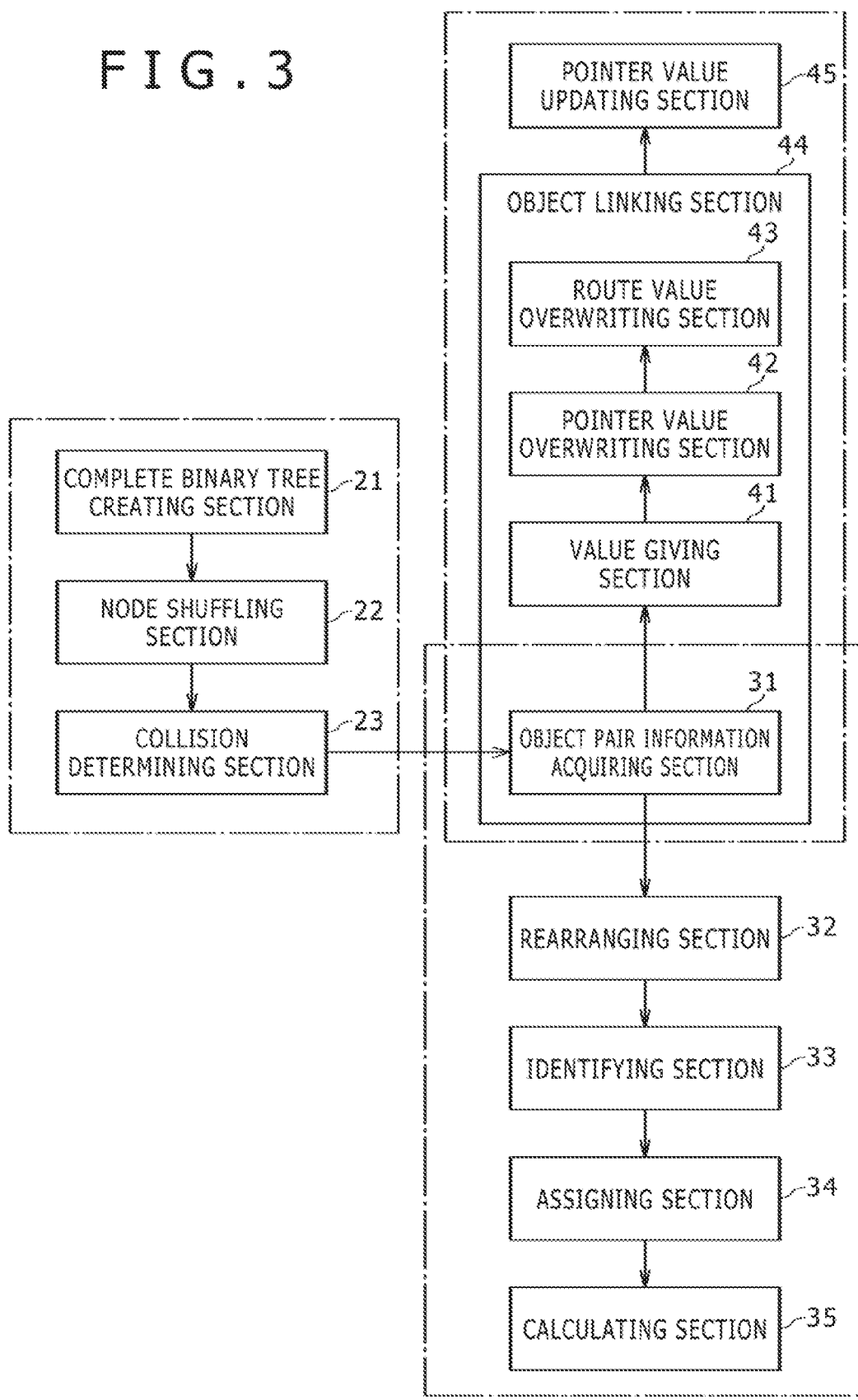
FIG. 3 is a functional block diagram depicting one example of main functions executed by the simulation device 1 according to the present embodiment.

FIG. 3 is a functional block diagram depicting one example of main functions executed by the simulation device 1 according to the present embodiment. As depicted in FIG. 3, the control unit 11 of the simulation device 1 in the present embodiment is configured to functionally include a complete binary tree creating section 21, a node shuffling section 22, a collision determining section 23, an object pair information acquiring section 31, a rearranging section 32, an identifying section 33, an assigning section 34, a calculating section 35, a value giving section 41, a pointer value overwriting section 43, a route value overwriting section 43, and a pointer value updating section 45 for example. These functions are implemented through execution of the program stored in the storing unit 12 by the control unit 11. This program is provided to the simulation device 1 via a computer-readable information storage medium such as an optical disc, magnetic disc, magnetic tape, magneto-optical disc, or flash memory or via communication means such as the Internet.

First, the collision determination processing of the objects by the processing S2 will be described. The collision determination processing of the objects is implemented by the complete binary tree creating section 21, the node shuffling section 22, and the collision determining section 23 depicted in FIG. 3.

The complete binary tree creating section 21 associates position information indicating the position in the virtual space about each of the plural objects disposed in the virtual space with a leaf and creates a complete binary tree in which position information reflecting pieces of the position information of child nodes is associated with an internal node.

The position information indicating the position of the object in the virtual space may be information that can indicate the positional relationship among the respective objects in the virtual space on the basis of attribute information associated with the object (e.g. information that defines the outer shape) and coordinate information of the virtual space. For example, as the position information, a so-called boundary volume that contains the object is used. This boundary volume is what depicts, in a simplifying manner, the position and size of a region in which the object is inscribed in the virtual space. Because the boundary volume is information obtained by simplifying the shape of the object, processing can be executed at a higher speed when collision determination is carried out on the boundary volume than when collision determination is carried out on the detailed model of the object. As the boundary volume, e.g. a sphere, an axis-aligned bounding box (AABB), which is a cuboid having sides parallel to the respective axes (x-, y-, and z-axes), etc. is used. If the boundary volume is a sphere, the center coordinates and radius of the sphere are employed as the position information. If the boundary volume is an axis-aligned bounding box, the coordinate values of the minimum point at which the coordinate values of the respective axes are the smallest among the vertexes of the axis-aligned bounding box and the maximum point at which the coordinate values of the respective axes are the largest are employed as the position information. Furthermore, if the boundary volume is an axis-aligned bounding box, the center coordinates of the axis-aligned bounding box and the distances from the center to a respective one of three planes orthogonal to each other may be employed as the position information. That is, it suffices that the shape and the position in the virtual space about the boundary volume of the object can be indicated by the position information.

Here, an example in which the axis-aligned bounding box is used as the position information will be depicted. The complete binary tree creating section 21 associates information on the axis-aligned bounding box (the coordinate value of the maximum point, the coordinate value of the minimum point, and so forth) of each of plural objects disposed in a virtual space as position information with a leaf. At this time, the complete binary tree creating section 21 may associate the position information of each object with the leaf in order of the identifier associated with each object, or may randomly associate the position information of each object with the leaf.

Then, the complete binary tree creating section 21 associates a parent node having two leaves as child nodes with information on a new boundary volume in which the boundary volumes indicated by a respective one of the two pieces of position information associated with the two child nodes are inscribed as position information. Specifically, the complete binary tree creating section 21 associates information on a new axis-aligned bounding box containing axis-aligned bounding boxes indicated by the two pieces of position information associated with the two leaves as the child notes of the parent node as the position information of this parent node. The complete binary tree creating section 21 executes this processing for each pair of two leaves and associates position information with each parent node. Furthermore, the complete binary tree creating section 21 associates a parent node having two nodes with which the position information is associated as child nodes with information on a new axis-aligned bounding box containing the axis-aligned bounding boxes indicated by the two pieces of position information associated with the two nodes as position information. The complete binary tree creating section 21 executes this processing for each pair of two nodes and associates position information with each parent node. In this manner, the complete binary tree creating section 21 executes the processing of associating position information with a parent node about each pair of two nodes up to the root to thereby create a complete binary tree in which the position information is associated with all nodes.

Figure 4:
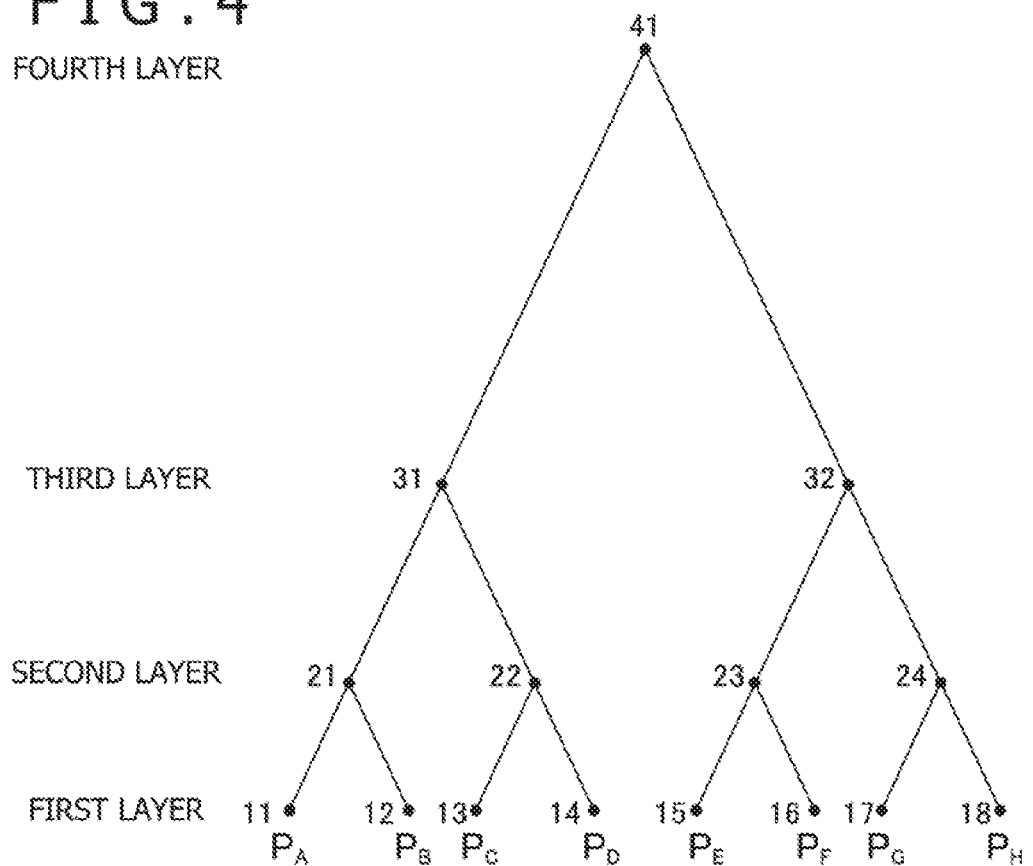
FIG. 4 is a diagram depicting one example of a complete binary tree.

The processing executed by the complete binary tree creating section 21 will be specifically described by using a complete binary tree exemplified in FIG. 4. As depicted in FIG. 4, the complete binary tree includes leaves as a first layer and sequentially forms a second layer, a third layer, and a fourth layer, with the fourth layer being the root. For convenience, the level and position of each leaf and each node will be identified by defining the respective leaves of the first layer as a leaf 11 to a leaf 18 from the left and defining the respective nodes of the second layer as a node 21 to a node 24 from the left and defining the respective nodes of the third layer as a node 31 and a node 32 from the left. Here, for example, suppose that eight objects of an object A to an object H (A to H are defined as identifiers) are disposed in a virtual space. Suppose that, at this time, axis-aligned bounding boxes serving as the position information of the respective objects are represented as $P_A$ to $P_H$. In this case, the complete binary tree creating section 21 associates the pieces of position information $P_A$ to $P_H$ of the respective objects with the leaf 11 to the leaf 18, respectively, of the first layer in order of the identifier. Then, the complete binary tree creating section 21 associates the node 21 with a new axis-aligned boundary volume as $P_{AB}$ containing the axis-aligned boundary volume indicated by the position information $P_A$ associated with the leaf 11 and the axis-aligned boundary volume indicated by the position information $P_B$ associated with the leaf 12. Similarly, the complete binary tree creating section 21 associates the node 22 with a new axis-aligned boundary volume as $P_{CD}$ containing the axis-aligned boundary volume indicated by the position information $P_C$ associated with the leaf 13 and the axis-aligned boundary volume $P_D$ indicated by the position information associated with the leaf 14. Furthermore, the complete binary tree creating section 21 associates the node 31 with a new axis-aligned boundary volume as $P_{ABCD}$ containing the axis-aligned boundary volume indicated by the position information $P_{AB}$ associated with the node 21 and the axis-aligned boundary volume indicated by the position information $P_{CD}$ associated with the node 22. If the complete binary tree creating section 21 associates parent nodes with new axis-aligned boundary volumes containing axis-aligned boundary volumes indicated by pieces of position information associated with two child nodes in this manner, $P_{EF}$, $P_{GH}$, and $P_{EFGH}$ are associated with the node 23, the node 24, and the node 32, respectively. Note that the position information associated with the root is an axis-aligned boundary volume containing all of the object A to the object H disposed in the virtual space.

From the immediately-upper layer of the lowermost layer (leaf layer) of the complete binary tree created by the complete binary tree creating section 21, regarding each group of $2^n$ (n≥1) nodes, the node shuffling section 22 shuffles $2 \cdot 2^n$ child nodes on the basis of the position information associated with each of the $2 \cdot 2^n$ child nodes belonging to the $2^n$ nodes. Here, the node shuffling section 22 shuffles the pieces of position information of the respective objects associated with leaves of the complete binary tree created by the complete binary tree creating section 21 into a form reflecting the positional relationship in the virtual space.

The processing executed by the node shuffling section 22 will be specifically described by using the complete binary tree exemplified in FIG. 4. For example, assuming that n=1, in the second layer of the complete binary tree created by the complete binary tree creating section 21, regarding each pair of two nodes (the node 21 and the node 22, the node 23 and the node 24), the node shuffling section 22 shuffles the child nodes on the basis of the four pieces of position information ($P_A$ to $P_D$, $P_E$ to $P_H$) associated with the child nodes (the leaf 11 to the leaf 14, the leaf 15 to the leaf 18). Although processing about the node 21 and the node 22 will be described here, suppose that processing about the node 23 and the node 24 is also simultaneously executed. First, the node shuffling section 22 selects an axis-aligned bounding box whose positional relationship with the axis-aligned bounding box indicated by the position information $P_A$ is comparatively close among the axis-aligned bounding boxes indicated by a respective one of the pieces of position information $P_B$, $P_C$, and $P_D$. For example, regarding each of pairs between the position information $P_A$ and the position information $P_B$, between the position information $P_A$ and the position information $P_C$, and between the position information $P_A$ and the position information $P_D$, the node shuffling section 22 obtains the volume (defined as $V_{AB}$, $V_{AC}$, and $V_{AD}$, respectively) of a new axis-aligned bounding box containing the axis-aligned bounding boxes indicated by the two pieces of position information. Then, when this volume is smaller, it is determined that the positions of the axis-aligned bounding boxes indicated by the two pieces of position information are closer. The node shuffling section 22 shuffles the pieces of position information $P_A$ to $P_D$ so that the combination yielding the smallest volume may belong to the node 21. For example, if it is determined that the volume $V_{AC}$ is the smallest, the node shuffling section 22 interchanges the position information $P_B$ and the position information $P_C$ so that the position information $P_A$ and the position information $P_C$ may belong to the node 21 and the position information $P_B$ and the position information $P_D$ may belong to the node 22. Then, a new axis-aligned bounding box containing the axis-aligned bounding boxes indicated by a respective one of the position information $P_A$ and the position information $P_C$ is associated with the node 21 as position information $P_{AC}$, and a new axis-aligned bounding box containing the axis-aligned bounding boxes indicated by a respective one of the position information $P_B$ and the position information $P_D$ is associated with the node 22 as position information $P_{BD}$.

Then, after the completion of the node shuffling about the second layer, in the third layer of the complete binary tree in which the nodes have been shuffled about the second layer, the node shuffling section 22 executes processing similar to the above-described processing in the second layer about the child nodes of each of two nodes (the node 31 and the node 32). The complete binary tree exemplified in FIG. 4 is up to the fourth layer. However, in a complete binary tree having a deeper level, such processing is executed in each layer up to the highest layer (root). The processing by the node shuffling section 22 may be sequentially executed from the immediately-upper layer of the lowermost layer up to the highest layer, or may be executed in the respective layers in arbitrary order.

Another processing method carried out by the node shuffling section 22 will be described by using the complete binary tree exemplified in FIG. 4. For example, assuming that n=1, a description will be made about processing of shuffling the child nodes in the second layer of the complete binary tree created by the complete binary tree creating section 21 on the basis of the four pieces of position information ($P_A$ to $P_D$, $P_E$ to $P_H$) associated with the child nodes (the leaf 11 to the leaf 14) of the node 21 and the node 22. First, as combination candidates of pieces of position information associated with the node 21 and the node 22, three combinations of $P_{AB}$ and $P_{CD}$, $P_{AC}$ and $P_{BD}$, and $P_{AD}$ and $P_{BC}$ are possible. The optimum combination reflecting the positional relationship in the virtual space is selected from these three combination candidates. Along with this, with each combination candidate, the node shuffling section 22 obtains the sum of the volumes of axis-aligned bounding boxes indicated by the pieces of position information associated with a respective one of the node 21 and the node 22 (sums are $V_{AB}+V_{CD}$, $V_{AC}+V_{BD}$, and $V_{AD}+V_{BC}$, respectively). Then, the combination yielding the smallest value is selected as the optimum combination among $V_{AB}+V_{CD}$, $V_{AC}+V_{BD}$, and $V_{AD}+V_{BC}$. Then, the node shuffling section 22 shuffles the respective nodes so that the selected optimum combination may be obtained. For example, if $V_{AC}+V_{BD}$ is the smallest, the node shuffling section 22 interchanges the position information $P_B$ and the position information $P_C$ so that the position information $P_A$ and the position information $P_C$ may belong to the node 21 and the position information $P_B$ and the position information $P_D$ may belong to the node 22.

In the above description, in order to decide a combination of two axis-aligned bounding boxes whose positional relationship is relatively close from the axis-aligned bounding boxes associated with a respective one of plural child nodes as the shuffling target, the node shuffling section 22 actually calculates the volume of the axis-aligned bounding box containing the two axis-aligned bounding boxes as a combination candidate and shuffles the child nodes so that two child nodes associated with two axis-aligned bounding boxes contained in the axis-aligned bounding box with a small volume may belong to the same parent node. However, the node shuffling section 22 is not limited by such a method and may decide the combination of two axis-aligned bounding boxes whose positional relationship is relatively close by various kinds of methods. For example, the node shuffling section 22 may decide the combination of two axis-aligned bounding boxes whose positional relationship is relatively close by using a numerical value such as the sum of the lengths of three sides of the axis-aligned bounding box containing two axis-aligned bounding boxes as a combination candidate or the length of the diagonal as the determination criterion. Also in this case, when the numerical value used as the determination criterion is smaller, it can be determined that the size of the axis-aligned bounding box itself containing two axis-aligned bounding boxes is smaller and it can be determined that the positions of the two axis-aligned bounding boxes are relatively closer.

Figure 5:
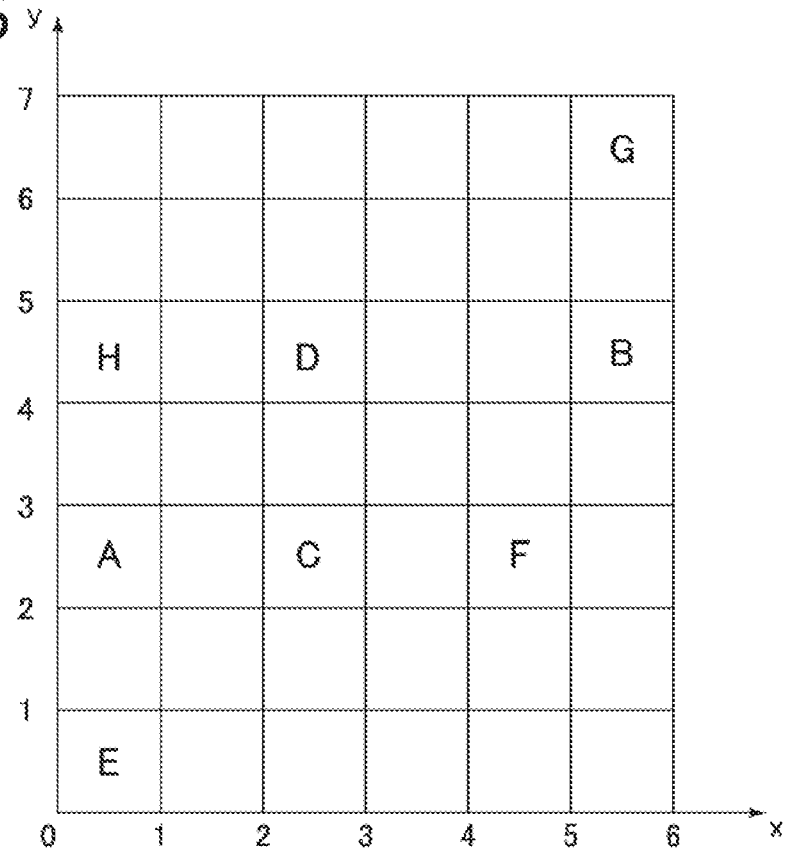
FIG. 5 is a diagram depicting a simplified model of plural objects disposed in a virtual space.

An example in which the above-described processing by the complete binary tree creating section 21 and the node shuffling section 22 is executed by using a simplified model will be depicted. The simplified model of plural objects disposed in a virtual space is depicted in FIG. 5. In the simplified model depicted in FIG. 5, in a two-dimensional space (x-y coordinates) of a lattice manner, objects (suppose that one grid indicates the object) having an equal size are disposed. Here, eight objects of the object A to the object H (A to H are defined as identifiers) are disposed in the two-dimensional space. Furthermore, the axis-aligned bounding box serving as the position information is also represented by grids. For example, suppose that the position information $P_A$ of the object A is an axis-aligned bounding box represented by a coordinate value (0, 2) of the minimum point at which the coordinate values of the respective axes are the smallest and a coordinate value (1, 3) of the maximum point at which the coordinate values of the respective axes are the largest. The processing of this example aims at creating a complete binary tree reflecting the positional relationship among the object A to the object H in this two-dimensional space.

Figure 6A:
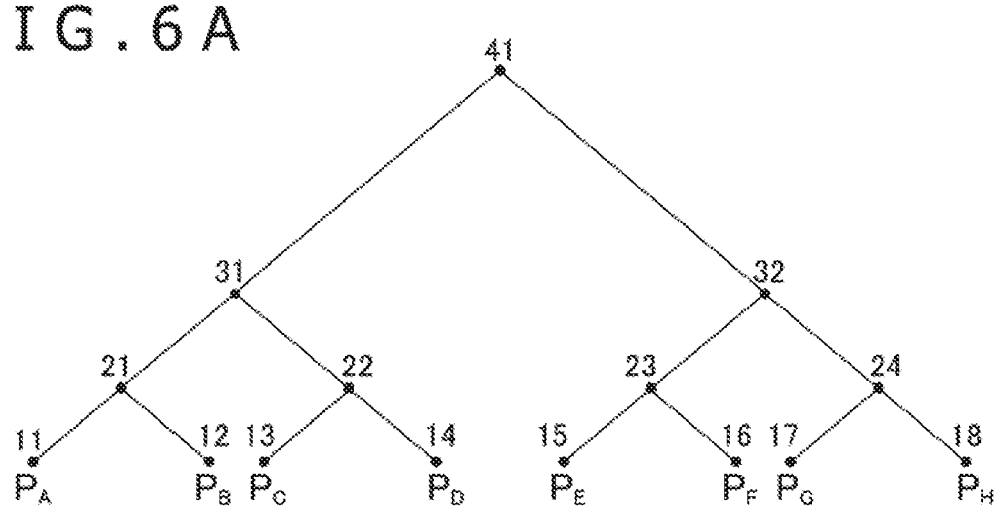
FIG. 6A is a diagram depicting one example of a complete binary tree created by a complete binary tree creating section 21.

First, the complete binary tree creating section 21 associates the pieces of position information $P_A$ to $P_H$ of the object A to the object H, respectively, with the leaf 11 to the leaf 18 in order of the identifier to create a complete binary tree depicted in FIG. 6A. Next, regarding the node 21 and the node 22 of the second layer, the node shuffling section 22 obtains the volume (equivalent to the area, in the simplified model) of a new axis-aligned bounding box containing axis-aligned bounding boxes indicated by two pieces of position information about each of pairs between the position information $P_A$ and the position information $P_B$, between the position information $P_A$ and the position information $P_C$, and between the position information $P_A$ and the position information $P_D$. Here, if the minimum point coordinates are defined as (xs, ys) and the maximum point coordinates are defined as (x1, y1), the area V is V=(x1−xs)(y1−ys). First, the new axis-aligned bounding box $P_{AB}$ containing the axis-aligned bounding boxes indicated by the position information $P_A$ (minimum point (0, 2), maximum point (1, 3)) and the position information $P_B$ (minimum point (5, 4), maximum point (6, 5)) is represented by a minimum point (0, 2) and a maximum point (6, 5). Furthermore, the area of the axis-aligned bounding box $P_{AB}$ is $V_{AB}$=18. Similarly, the new axis-aligned bounding box $P_{AC}$ containing the axis-aligned bounding boxes indicated by the position information $P_A$ (minimum point (0, 2), maximum point (0, 3)) and the position information $P_C$ (minimum point (2, 2), maximum point (3, 3)) is represented by a minimum point (0, 2) and a maximum point (3, 3) and has an area $V_{AC}$=3. The new axis-aligned bounding box $P_{AD}$ containing the axis-aligned bounding boxes indicated by the position information $P_A$ (minimum point (0, 2), maximum point (0, 3)) and the position information $P_D$ (minimum point (2, 4), maximum point (3, 5)) is represented by a minimum point (0, 2) and a maximum point (3, 5) and has an area $V_{AD}$=9. From the above, the areas of the new axis-aligned bounding boxes are $V_{AB}$=18, $V_{AC}$=3, and $V_{AD}$=9, and $V_{AC}$ is the smallest. Thus, the position information $P_B$ and the position information $P_C$ are interchanged so that the position information $P_A$ and the position information $P_C$ may belong to the node 21. Then, also regarding the node 23 and the node 24 of the second layer, areas $V_{EF}$, $V_{EG}$, and $V_{EH}$ of new axis-aligned bounding boxes containing axis-aligned bounding boxes indicated by two pieces of position information are obtained about a respective one of pairs between the position information $P_E$ and the position information $P_F$, between the position information $P_E$ and the position information $P_G$, and between the position information $P_E$ and the position information $P_H$. As a result, $V_{EF}$=15, $V_{EG}$=42, and $V_{EH}$=5 are obtained. Therefore, $V_{EH}$ is the smallest and thus the node shuffling section 22 interchanges the position information $P_F$ and the position information $P_H$ so that the position information $P_E$ and the position information $P_H$ may belong to the node 23. From the above, the complete binary tree after the completion of the node shuffling processing about the second layer becomes FIG. 6B.

Figure 6B:
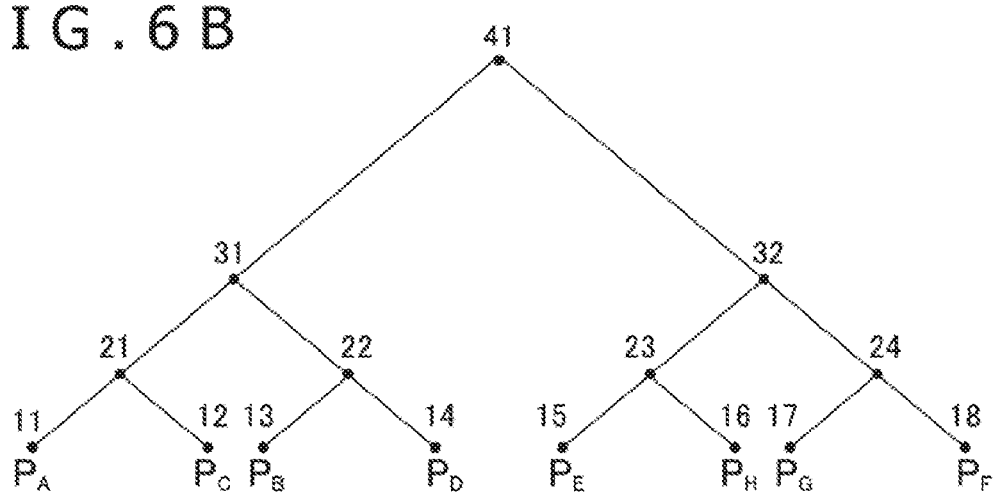
FIG. 6B is a diagram depicting one example of the complete binary tree after the completion of node shuffling processing about a second layer.

Next, the node shuffling section 22 executes node shuffling processing about the third layer by using the complete binary tree of FIG. 6B. Regarding the node 31 and the node 32 in the third layer, the areas of new axis-aligned bounding boxes containing axis-aligned bounding boxes indicated by two pieces of position information are obtained about a respective one of pairs between the position information $P_{AC}$ and the position information $P_{BD}$, between the position information $P_{AC}$ and the position information $P_{EH}$, and between the position information $P_{AC}$ and the position information $P_{GF}$. As a result, $V_{ACBD}$=18, $V_{ACEH}$=15, and $V_{ACGF}$=30 are obtained. Therefore, $V_{ACEH}$ is the smallest and thus the node shuffling section 22 interchanges the position information $P_{BD}$ and the position information $P_{EH}$ so that the position information $P_{AC}$ and the position information $P_{EH}$ may belong to the node 31, and the processing by the node shuffling section 22 is ended. From the above, the complete binary tree after the completion of the node shuffling processing about the third layer becomes FIG. 6C. Thus, the complete binary tree depicted in FIG. 6C in which the positional relationship among the objects in the virtual space is reflected is obtained.

Figure 6C:
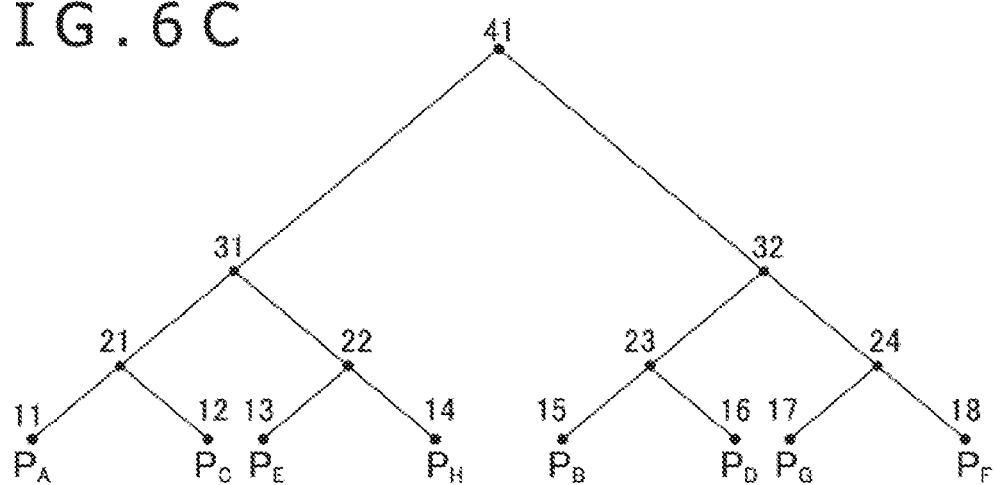
FIG. 6C is a diagram depicting one example of the complete binary tree after the completion of the node shuffling processing about a third layer.

Moreover, by using a complete binary tree created by the complete binary tree creating section 21 and the node shuffling section 22 at the time counter t=n, processing by the node shuffling section 22 at the time counter t=n+1 may be executed. Specifically, for example, suppose that the complete binary tree depicted in FIG. 6C is created at the time counter t=n. Then, when the complete binary tree creating section 21 creates a complete binary tree at the time counter t=n+1, the pieces of position information of the objects disposed in the virtual space at the time counter t=n+1 are associated in the same order as the leaves of the complete binary tree depicted in FIG. 6C. That is, the complete binary tree creating section 21 associates each of the pieces of position information $P_A$, $P_C$, $P_E$, $P_H$, $P_B$, $P_D$, $P_G$, and $P_F$ from the left in the leaves. Note that in the complete binary tree at the time counter t=n+1, the order of the position information is the same as the complete binary tree at t=n in FIG. 6C, and regarding the contents of the pieces of position information, the pieces of position information in the virtual space at the time counter t=n+1 are reflected. This intends to gradually turn the complete binary tree to the optimum form as the time counter is incremented by carrying over, at the time counter t=n+1, the correspondence relationship between the respective objects and the leaves at the time counter t=n because it is rare that the positions of the respective objects dramatically change between at the time counter t=n and at the time counter t=n+1.

In the complete binary tree, all nodes inevitably have two child nodes. Therefore, whichever $2^n$ nodes are selected, the number of child nodes thereof is equal. Thus, the node shuffling processing executed by the node shuffling section 22 based on pieces of position information associated with the child nodes of the $2^n$ nodes can be executed by the same algorithm whichever $2^n$ nodes are selected. Therefore, the node shuffling section 22 can execute the node shuffling processing in parallel about each of $2^n$ nodes in the respective layers.

Furthermore, in some cases, the complete binary tree completed by the node shuffling processing by the above-described node shuffling section 22 is not the optimum complete binary tree reflecting the positional relationship among the objects in the virtual space. This is attributed to that processing falls into a local solution when the node shuffling section 22 executes optimization processing of obtaining the combination with which the positional relationship between two objects becomes the smallest in the case of dividing the objects in the virtual space into combinations of two objects. Accordingly, a description will be made about processing for reducing the possibility of falling into a local solution, executed by the node shuffling section 22. As described above, the node shuffling section 22 decides a combination of two pieces of position information whose positional relationship is relatively close from pieces of position information associated with a respective one of plural child nodes as the shuffling target. Here, regarding each of combination candidates, the node shuffling section 22 obtains a numerical value quantitatively indicating the positional relationship between two child nodes in the combination candidate and randomly changes the numerical value in either the increase direction or the decrease direction (i.e. adds noise to the numerical value). Then, the node shuffling section 22 employs a combination candidate with which the numerical value resulting from the change is small and executes node shuffling processing so that the combination candidate may be obtained. As a concrete example, as the numerical value quantitatively indicating the positional relationship between two child nodes, the node shuffling section 22 uses the size of a region containing regions indicated by a respective one of two pieces of position information associated with the two child nodes (e.g. the volume of an axis-aligned bounding box or the like). By adding random noise to the value quantitatively indicating the positional relationship between two child nodes and evaluating the resulting value regarding each combination candidate in this manner, a global optimal solution can be obtained. A description will be made below by using FIG. 4 about concrete processing for reducing the possibility of falling into a local solution by the node shuffling section 22.

First, a description will be made about processing of shuffling the child nodes in the second layer of the complete binary tree depicted in FIG. 4 on the basis of the four pieces of position information ($P_A$ to $P_D$, $P_E$ to $P_H$) associated with the child nodes (the leaf 11 to the leaf 14) of the node 21 and the node 22. First, as combination candidates of pieces of position information associated with the node 21 and the node 22, there are three combinations of $P_{AB}$ and $P_{CD}$, $P_{AC}$ and $P_{BD}$, and $P_{AD}$ and $P_{BC}$. The optimum combination reflecting the positional relationship in the virtual space is selected from these three combinations. Furthermore, the node shuffling section 22 selects, from the respective combination candidates, the combination with which the sum of the volumes of axis-aligned bounding boxes indicated by the pieces of position information associated with a respective one of the node 21 and the node 22 becomes the smallest. Here, when obtaining the sums of the volumes of the axis-aligned bounding boxes indicated by the pieces of position information associated with a respective one of the node 21 and the node 22, the node shuffling section 22 adds noise to the volumes ($V_{AB}$, $V_{CD}$, $V_{AC}$, $V_{BD}$, $V_{AD}$, $V_{BC}$) of the axis-aligned bounding boxes indicated by the pieces of position information associated with the respective nodes. That is, with the respective combination candidates, the sums of the volumes of the axis-aligned bounding boxes indicated by the pieces of position information associated with a respective one of the node 21 and the node 22 are obtained as $(1+\alpha_1)V_{AB}+(1+\alpha_2)V_{CD}$, $(1+\alpha_3)V_{AC}+(1+\alpha_4)V_{BD}$, and $(1+\alpha_5)V_{AD}+(1+\alpha_6)V_{BC}$. Here, suppose that $\alpha_m$ (m=1 to 6) is randomly given in a range of $0<\alpha_m<1$. Furthermore, three kinds of values may be defined as $\alpha_m$ in advance and be randomly assigned to the respective combination candidates. Then, the node shuffling section 22 selects the combination with which the sum of the volumes, to which the noise is added, of the axis-aligned bounding boxes indicated by two pieces of position information is the smallest from the respective combination candidates and shuffles the nodes. By execution of such processing by the node shuffling section 22 in shuffling of child nodes about each pair of two nodes, the possibility of falling into a local solution is reduced and finally the optimum complete binary tree reflecting the positional relationship among the objects in the virtual space is completed.

In the above description, the node shuffling section 22 uses the size of a region in which two regions indicated by two pieces of position information are inscribed, more specifically the voltage of an axis-aligned bounding box containing axis-aligned bounding boxes indicated by the two pieces of position information, as the value quantitatively indicating the positional relationship between two child nodes in each combination candidate. However, the value is not limited to this example. For example, the node shuffling section 22 may use a numerical value such as the sum of the lengths of three sides of the axis-aligned bounding boxes indicated by two pieces of position information as a combination candidate or the length of the diagonal as the value quantitatively indicating the positional relationship between the two pieces of position information. Also in this case, the node shuffling section 22 randomly changes the numerical value used as the value quantitatively indicating the positional relationship between two child nodes and executes node shuffling processing on the basis of this changed numerical value.

The collision determining section 23 executes simulation processing of carrying out collision determination between objects by using the complete binary tree in which shuffling has been completed by the node shuffling section 22. The collision determination is carried out about child nodes of each node of the complete binary tree on the basis of the position information each associated. As a collision determination method, for example in the case in which the determination is based on position information using the spherical boundary volume, there is a method in which it is determined that spherical boundary volumes are colliding if the distance between the center coordinates is shorter than the sum of the two radii. Furthermore, in the case in which the determination is based on position information using the axis-aligned bounding box, it is determined whether overlapping is present on the respective axes on the basis of the coordinate value of the minimum point and the coordinate value of the maximum point, and it is determined that axis-aligned boxes are colliding if it is determined that overlapping is present on all of the three axes. Furthermore, if the center coordinates in the axis-aligned bounding box and the distances from the center to a respective one of three planes orthogonal to each other are used as position information, it may be determined whether the distance between the center coordinates is shorter than the sum of the two radii (distances from the center to a plane) in the respective axes, and it may be determined that axis-aligned bounding boxes are colliding if it is determined that the distance is shorter in all of the three axes.

The collision determination by the collision determining section 23 in the present embodiment is carried out by using a complete binary tree in which nodes have been shuffled by the node shuffling section 22. The collision determining section 23 carries out the collision determination about two nodes in each layer from the root of the complete binary tree to the leaves sequentially on the basis of the position information associated with each of the nodes. Furthermore, if it is determined about the two nodes that axis-aligned bounding boxes indicated by the pieces of position information associated with a respective one of the nodes are colliding, the collision determining section 23 carries out collision determination in all combinations about the four child nodes of the two nodes. Moreover, if it is determined about the two nodes that the axis-aligned bounding boxes are not colliding, the collision determining section 23 carries out collision determination about the child nodes of each of the two nodes. This is processing executed under the following thought. Specifically, if it is determined that a collision is occurring about the two nodes, there is a possibility that it is determined that a collision is occurring also about child nodes thereof. If it is determined that a collision is not occurring about the two nodes, it can be determined that child nodes thereof are not occurring. The position information associated with a node includes pieces of position information of all subordinate nodes belonging to the node. Therefore, if it is determined that a collision is not occurring in pieces of position information associated with superior nodes, it can be said that a collision is not occurring also in pieces of position information associated with subordinate nodes. This allows the collision determining section 23 to skip collision determination between objects that do not collide.

Here, concrete processing executed by the collision determining section 23 will be described by using the simplified model depicted in FIG. 5. The collision determining section 23 carries out collision determination in each layer sequentially from the third layer to the first layer of the complete binary tree depicted in FIG. 6C, in which shuffling has been completed by the node shuffling section 22. First, regarding the nodes of the third layer (the node 31 and the node 32), the collision determining section 23 carries out collision determination between objects by using the above-described collision determination method on the basis of the position information $P_{ACEH}$ associated with the node 31 and the position information $P_{BDGF}$ associated with the node 32. Here, the collision determining section 23 determines whether overlapping is caused in the respective axes between an axis-aligned bounding box indicated by the position information $P_{ACEH}$ (minimum point (0, 0), maximum point (3, 5)) and an axis-aligned bounding box indicated by the position information $P_{BDGFH}$ (minimum point (2, 2), maximum point (6, 7)). As a result, it is determined that overlapping is caused in a range with a minimum point (2, 2) and a maximum point (3, 5) and the axis-aligned bounding box indicated by the position information $P_{ACEH}$ and the axis-aligned bounding box indicated by the position information $P_{BDGFH}$ are colliding. Then, because it is determined that the collision is occurring about the node 31 and the node 32, the collision determining section 23 carries out collision determination also about all combinations of the child nodes thereof in the collision determination in the second layer. That is, the collision determining section 23 carries out collision determination about each of the combinations between the node 21 and the node 22, between the node 21 and the node 23, between the node 21 and the node 24, between the node 22 and the node 23, between the node 22 and the node 24, and between the node 23 and the node 24. If the determinations are made by using the above-described collision determination method, it is determined that collisions are occurring about the node 21 and the node 22 and about the node 23 and the node 24. Then, the collision determining section 23 carries out collision determination also about all combinations of the child nodes thereof in the collision determination in the first layer. As the result of the collision determination in the first layer, two objects colliding with each other are identified.

As described above, in the collision determination processing in the respective layers by the collision determining section 23, determination of collision is carried out on the basis of pieces of position information each associated with a respective one of two nodes. Therefore, the collision determination processing is processing of the same algorithm, in which determination of collision is carried out on the basis of pieces of position information associated with nodes whichever nodes are selected. Thus, each of the combinations of two nodes about which determination of collision is carried out in the respective layers can be processed in parallel.

Next, the physical quantity calculation processing of the objects by the processing S4 will be described. The physical quantity calculation processing of the objects is implemented by the object pair information acquiring section 31, the rearranging section 32, the identifying section 33, the assigning section 34, and the calculating section 35 depicted in FIG. 3.

Here, by solving the constraint condition of two objects in contact with each other, the physical quantities that should be given to the respective objects in order to satisfy the constraint condition are calculated. However, there is a case in which e.g. object pair 1 (object A and object B) and object pair 2 (object A and object C) simultaneously exist as pairs of objects in contact with each other. In this case, both object pairs include the object A in common. Therefore, calculations about the respective object pairs are mutually dependent and are difficult to process in parallel. Along with this, plural pairs of objects in contact with each other are grouped into plural stages at which processing is executed at different timings. Each stage has plural threads that can be processed in parallel and assignment of object pairs to the respective threads enables processing of each of the object pairs in parallel. Furthermore, at the timing when each stage is processed, calculations about the object pairs assigned to the stage are performed in parallel. Details will be described below.

The object pair information acquiring section 31 sequentially acquires pieces of information on object pairs composed of two objects in contact with each other as constituent elements. The object pair information acquiring section 31 acquires two objects determined to collide by the collision determining section 23 as two objects in contact with each other. Furthermore, hereinafter, the object pair whose information is acquired by the object pair information acquiring section 31 and that is composed of two objects in contact with each other will be represented as the acquired object pair. In addition, the information on the object pair may be an identifier of each object and attribute information.

The assigning section 34 assigns each of plural acquired object pairs acquired by the object pair information acquiring section 31 to any of plural stages in such a manner that two or more acquired object pairs including an object common to these acquired object pairs do not belong to the same stage.

Figures 7, 8:
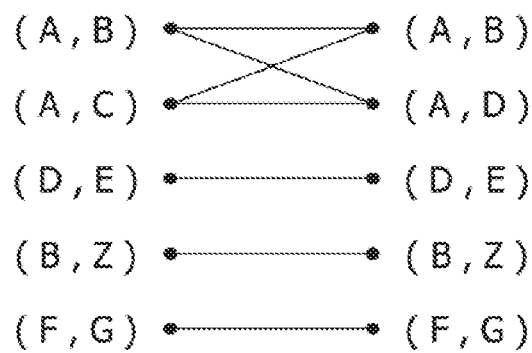
FIG. 7 is a diagram depicting one example of acquired object pairs and an object check table to manage assignment of the acquired object pairs.
FIG. 8 depicts one example of determination target pairs and comparison target pairs.
Figures 10, 11A:
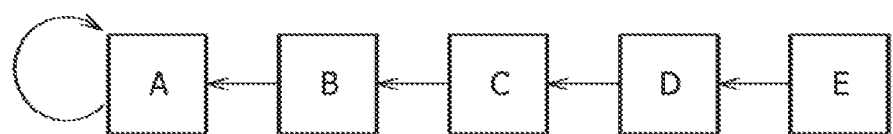
FIG. 10 is a diagram depicting one example of the procedure of linking of objects.
FIG. 11A is a diagram schematically depicting one example of linked objects linked by an object linking section 44.

The processing executed by the assigning section 34 will be specifically described by using FIG. 7. FIG. 7 is a diagram depicting one example of acquired object pairs and an object check table to manage assignment of the acquired object pairs. Suppose that the object check table is held by the storing unit 12. The object check table exemplified in FIG. 10 is made by associating, on each stage basis, identifiers to identify the respective objects with flags indicating that calculation processing is executed on the objects identified by the identifiers. Specifically, if the flag is 1 at stage s (s≥0), this indicates that calculation processing is executed on the object identified by the identifier at stage s. If the flag is 0, calculation processing is not executed at stage s. In this object check table, all flags are 0 in the initial state.

First, suppose that plural acquired object pairs exemplified in FIG. 7 exist. The assigning section 34 assigns these acquired object pairs from stage 0 of the object check table sequentially. When acquiring the first acquired object pair (object A and object B), the assigning section 34 sets the flags of identifier A and identifier B corresponding to stage 0 to 1. Next, when the assigning section 34 acquires an acquired object pair (object A and object C), the acquired object pair (object A and object C) cannot be calculated at thread 0 because the flag of identifier A corresponding to stage 0 is 1 although the flag of identifier C is 0. Accordingly, because the flags of identifier A and identifier C corresponding to the next stage (stage 1) are 0, the assigning section 34 assigns the object pair (object A and object C) to stage 1. That is, the flags of identifier A and identifier C corresponding to stage 1 are set to 1. Then, the assigning section 34 can assign the next acquired object pair (object D and object E) to stage 0 and thus the flags of identifier D and identifier E corresponding to stage 0 are set to 1. In this manner, the flags are set about the acquired object pairs. By this object check table, the timing when processing of each of the acquired object pairs is executed can be seen.

The calculating section 35 calculates influence on the positions of the respective objects due to the contact of two objects in contact with each other. By solving the constraint condition of the two objects in contact with each other, the calculating section 35 calculates the physical quantities to be given to the respective objects in order to satisfy the constraint condition. In the present embodiment, regarding the acquired object pairs, the calculating section 35 solves the constraint condition of the acquired object pair to calculate the physical quantities to be given to the respective objects in order of the stage number assigned to the object check table created by the assigning section 34. Here, it is assumed that the calculating section 35 executes calculation processing from stage 0 sequentially. However, the order may be any as long as the respective stages are not calculated in parallel.

Here, in a physical simulation or the like to calculate the positions of objects changing over time about plural objects that move in a virtual space, for example a pair of objects in contact with each other at the time counter t=0 are in contact with each other also at the time counter t=1 in many cases. Along with this, among plural acquired object pairs at the time counter t=n, an object pair whose two constituent elements are common with any acquired object pair at the time counter t=n−1 (hereinafter, defined as the common object pair) is identified. Then, when the calculating section 35 performs calculation at the time counter t=n, the amount of processing of the calculation is reduced by using information on the common object pair. Processing of identifying the common object pair will be specifically described below. The processing of identifying the common objects is implemented by the rearranging section 32 and the identifying section 33.

Suppose that, first, due to a predetermined criterion, the identifying section 33 identifies one of two objects included in an acquired object pair as a reference object and identifies the other as an accompanying object. For example, on the basis of the magnitude of identifiers of the two objects included in the acquired object pair, the identifying section 33 employs the object whose identifier is smaller as the reference object. Specifically, regarding an object pair (object A and object B), the magnitude of the identifiers is A<B and thus object A is identified as the reference object and object B is identified as the accompanying object. Furthermore, the object whose identifier is larger may be employed as the reference object.

Then, the identifying section 33 employs each of plural acquired object pairs at t=n as a determination target pair and extracts an object pair whose reference object is common with the determination target pair among plural acquired object pairs at t=n−1 as a comparison target pair. Then, the identifying section 33 determines whether or not the accompanying object is common between the determination target pair and the comparison target pair, and identifies this determination target pair as a common object pair if the accompanying object is common. Note that if the accompanying object is not common, the identifying section 33 identifies this determination target pair as a new object pair that does not exist at t=n−1 and appears at t=n (hereinafter, defined as the new object pair). In FIG. 8, one example of the determination target pairs and the comparison target pairs is depicted. When (A, B) among the acquired object pairs at t=n in FIG. 8 is employed as the determination target pair, object pairs whose reference object is A among the acquired object pairs at t=n−1 are the comparison target pairs. That is, (A, B) and (A, D) are the comparison target pairs. As depicted in FIG. 8, the determination target pair (A, B) and (A, B) and (A, D) as the comparison target pairs thereof are coupled by lines, which indicates that these pairs correspond as the determination target pair and the comparison target pairs. Also regarding the other object pairs, the pair as the comparison target pair is associated with the determination target pair. Then, the identifying section 33 determines whether or not the accompanying object is common between the determination target pair (A, B) and each of the comparison target pairs (A, B) and (A, D). Here, because the accompanying object is B in both of the determination target pair (A, B) and the comparison target pair (A, B), the determination target pair (A, B) is identified as a common object pair. Furthermore, when the identifying section 33 determines whether or not the accompanying object is common between the determination target pair (A, C) and each of the comparison target pairs (A, B) and (A, D), the determination target pair (A, C) is identified as a new object pair because the accompanying object is different between the determination target pair and the comparison target pair in both combinations.

As above, the identifying section 33 identifies the reference object and the accompanying object in the acquired object pair and compares the accompanying objects of the determination target pair and the comparison target pairs whose reference object is common. This can narrow down the number of comparison target pairs that should be compared regarding each of the determination target pairs. Furthermore, the processing of determining whether or not the accompanying object is common between the determination target pair and the comparison target pairs, executed by the identifying section 33, can be executed by the same algorithm of extracting the comparison target pairs whose reference object is common and comparing the accompanying objects whichever determination target pair is selected. Thus, the identifying section 33 can execute the processing of determining whether or not the accompanying object is common with the comparison target pairs in parallel for each of the determination target pairs.

Here, the rearranging section 32 may rearrange the plural acquired object pairs at t=n−1 in order of the identifier of the reference object by using publicly-known bucket sort processing. For example, when the rearranging section 32 rearranges the acquired object pairs at t=n−1 depicted in FIG. 8, the order of the reference objects becomes A, A, B, D, and F. Here, when the number of appearances is calculated on each identifier basis, the following result is obtained: A: 2, B: 1, C: 0, D: 1, E: 0, and F: 1. Due to this, among the rearranged acquired object pairs, the object pairs in which the identifier of the reference object is A can be identified as the first and second object pairs (from the number of A's). Furthermore, the object pair in which the identifier of the reference object is B can be identified as the third object pair (from the sum of the numbers of A's and B's and the number of B's), and the object pair in which the identifier of the reference object is F can be identified as the fifth object pair (from the sum of the numbers of A's to F's and the number of F's). In this manner, the object pair having a specific identifier is identified due to the sum of the numbers of respective identifiers up to the identifier and the number of the identifiers. Thus, rearranging the acquired object pairs at t=n−1 in order of the identifier of the reference object allows the identifying section 33 to easily extract the comparison target pairs with respect to the determination target pair. Note that the rearranging section 32 may rearrange the plural acquired object pairs at t=n in order of the identifier of the reference object by using publicly-known bucket sort processing.

Furthermore, the identifying section 33 may employ each of the plural acquired object pairs at t=n−1 as the determination target pair and extract an object pair whose reference object is common with the determination target pair among the plural acquired object pairs at t=n as the comparison target pair. Then, the identifying section 33 determines whether or not the accompanying object is common between the determination target pair and the comparison target pair, and identifies this determination target pair as a common object pair if the accompanying object is common. Note that if the accompanying object is not common, the identifying section 33 identifies the determination target pair as a deleted object pair that exists at t=n−1 and does not exist at t=n. Specifically, the identifying section 33 determines whether or not the accompanying object is common between the determination target pair (A, B) at t=n−1 and each of the comparison target pairs (A, B) and (A, C) at t=n in FIG. 8. Here, because the accompanying object is B in both of the determination target pair (A, B) and the comparison target pair (A, B), the determination target pair (A, B) is identified as a common object pair. Furthermore, when the identifying section 33 determines whether or not the accompanying object is common between the determination target pair (A, D) and each of the comparison target pairs (A, B) and (A, C), the determination target pair (A, D) is identified as deleted objects because the accompanying object is different between the determination target pair and the comparison target pair in both combinations.

In this manner, the rearranging section 32 rearranges the determination target pairs and the comparison target pairs in order of the identifier. This can facilitate extraction processing of the comparison target pairs whose reference object is common with the determination target pair and increase the speed of the processing of identifying the common object pair by the identifying section 33.

Figure 9:
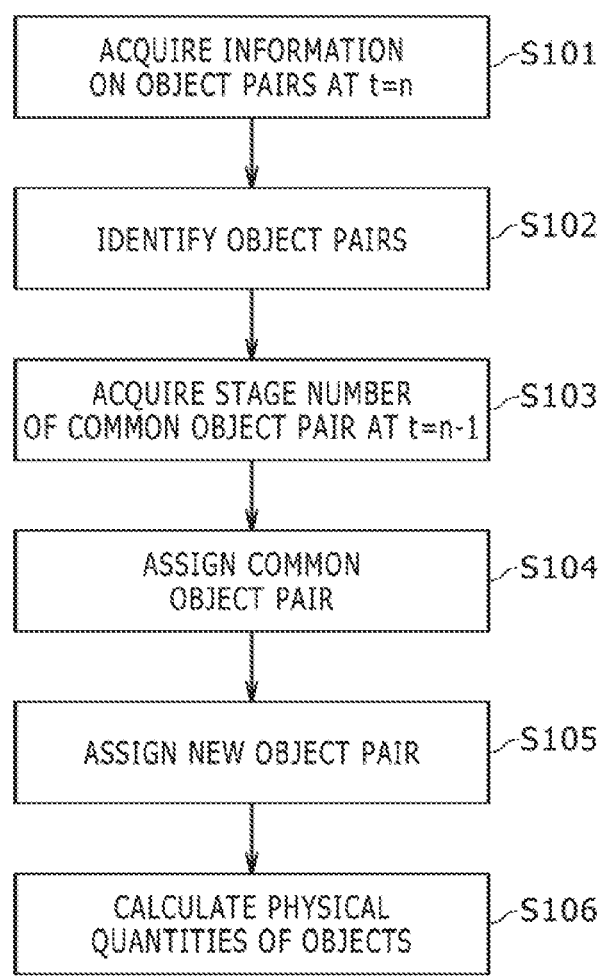
FIG. 9 is a flow diagram depicting one example of the flow of physical quantity calculation processing of objects by use of common object pairs according to the present embodiment.

Here, a description will be made about the physical quantity calculation processing of the objects by use of the common object pairs identified by the common object pair identification processing with reference to a flow diagram of FIG. 9.

The object pair information acquiring section 31 acquires information on pairs of objects in contact with each other at the time counter t=n (S101).

The identifying section 33 identifies common object pairs and new object pairs by comparing the acquired object pairs at t=n acquired by the object pair information acquiring section 31 in the processing S101 and object pairs acquired by the object pair information acquiring section 31 at the time counter t=n−1 (S102).

The assigning section 34 refers to the object check table at the time counter t=n−1 stored in the storing unit 12 and acquires the stage numbers to which the common object pairs identified by the identifying section 33 in the processing S102 are assigned (S103).

The assigning section 34 assigns the common object pairs to the object check table at the time counter t=n (S104). At this time, the assigning section 34 assigns the common object pairs to the stage numbers at the time counter t=n−1, acquired in the processing S103. That is, regarding the common object pairs, the same flag setting as the object check table at the time counter t=n−1 is carried out.

The assigning section 34 assigns the new object pairs to the object check table to which the common object pairs have been assigned in the processing S104 (S105). Then, the created object check table is associated with the time counter t=n and is held in the storing unit 12.

The calculating section 35 synthesizes the common object pairs and the new object pairs identified in the processing S102 to make processing object pairs. Then, regarding the processing object pairs, the calculating section 35 solves the constraint conditions of the object pairs to calculate the physical quantities that should be given to the respective objects in order of the stage number assigned in the object check table created in the processing S105 (S106).

In a physical simulation or the like, it is rare that the positions of objects greatly change in a period of a predetermined time interval d. Thus, when the acquired object pairs at t=n−1 and the acquired object pairs at t=n are compared, the number of common object pairs is larger than the number of new object pairs. By simplifying the assignment of the common object pairs, which involve a large amount of processing as above, the speed of the assignment processing of the assigning section 34 can be increased.

Next, the sleep management processing of the objects by the processing S5 will be described. The sleep management processing of the objects is implemented by the object pair information acquiring section 31, the value giving section 41, the pointer overwriting section 42, the route value overwriting section 43, an object linking section 44, and the pointer value updating section 45 depicted in FIG. 3.

In the case of carrying out the sleep management, plural objects in contact with each other need to be managed as one group, and the plural objects belonging to the same group need to be simultaneously made to sleep and be simultaneously released from sleep. This is because, otherwise, objects exhibit unnatural behavior such as popping and jittering and it becomes impossible to keep the continuity of the behavior in some cases in e.g. the case in which sleep of part of the objects is released but the other objects in contact remain sleeping. Specifically, the simulation device 1 manages plural objects in contact with each other as one group by giving an equal management ID to all objects included in linked objects formed by linking of the plural objects in contact with each other.

First, processing of creating linked objects by the object linking section 44 will be described. The processing of creating linked objects is implemented mainly by the object pair information acquiring section 31, the value giving section 41, the route value overwriting section 42, and the pointer value overwriting section 43.

The object linking section 44 links acquired object pairs acquired by the above-described object pair information acquiring section 31. The object linking section 44 employs any of three or more objects in contact with each other as a termination object and gives each object a pointer value indicating the contact-counterpart object to link the respective objects. Then, the three or more objects linked by the object linking section 44 become linked objects. Furthermore, the pointer value is set to the identifier of the contact-counterpart object and the pointer value of the termination object is invariably its own identifier. That is, the pointer value of the termination object does not indicate another object. Due to this, the linked objects are linked in one direction so that the respective objects may be oriented toward the termination object.

Here, the processing of creating linked objects will be described by using FIG. 10, which depicts one example of the procedure of linking of objects. For example, suppose that three objects, object A, object B, and object C, exist in a virtual space. These objects are acquired by the object pair information acquiring section 34 as acquired object pairs (A, C) and (B, C) at the time counter t=n. Suppose that such three objects in contact with each other at the time counter t=n will be linked.

As a premise for the creation of the linked objects, here, the respective objects are so linked that an object having a small identifier is employed as the termination object. For this purpose, first the value giving section 41 gives each object a route value and a pointer value. The route value is a value for deciding the direction indicated by the pointer value so as to employ the object having a small identifier as the termination object. Furthermore, suppose that the pointer value is set to indicate an object having a smaller route value from an object having a larger route value basically. Note that an object having a large identifier may be employed as the termination object. In this case, the pointer value is set to indicate an object having a larger route value from an object having a smaller route value basically.

As depicted in FIG. 10, the initial state (step 0) is set to a state in which none of the objects is linked and here the value giving section 41 gives each object the initial values of the route value and the pointer value. The initial values of the route value and the pointer value given to each object are set to the identifier of the object.

In step 1, when the acquired object pair (B, C) is acquired, the route value overwriting section 43 updates the route value given to the object whose route value is larger in the objects included in the acquired object pair (hereinafter, defined as the larger-route object) to the route value given to the object having a smaller route value (hereinafter, defined as the smaller-route object). Then, the pointer value overwriting section 42 updates the pointer value given to the larger-route object to the identifier of the smaller-route object. That is, the route value and the pointer value given to object C become B, so that a pointer from object C to object B is depicted.

In step 2, when the acquired object pair (A, C) is acquired, the route value overwriting section 43 updates the route value given to the larger-route object (object C) to the route value given to the smaller-route object (object A). Then, the pointer value overwriting section 42 updates the pointer value given to the larger-route object to the identifier of the smaller-route object as with step 1. That is, the route value and the pointer value given to object C become A.

In step 3, when the time counter t becomes t=n+1, the pointer values given to the respective objects are initialized. When the time counter t becomes t=n+1, the object pair information acquiring section 31 acquires acquired object pairs at the time counter t=n+1 and therefore the pointer values of the respective objects at the time counter t=n are initialized. However, the route values given to the respective objects are the values at the timing of the end of the processing of the time counter t=n.

In step 4, when the acquired object pair (B, C) is acquired, the route value overwriting section 43 updates the route value given to the larger-route object (object B) to the route value given to the smaller-route object (object C). Then, the pointer value overwriting section 42 updates the pointer value given to the larger-route object to the identifier of the smaller-route object. That is, the route value of object B becomes A and the pointer value becomes C, so that a pointer from object B to object C is depicted.

In step 5, when the acquired object pair (A, C) is acquired, the route values of object A and object C are compared. Here, the route value given to object A and the route value given to object C are equal. In such a case, through comparison of the identifiers of the objects, the pointer value overwriting section 42 updates the pointer value given to the object having the larger identifier (object C) to the identifier of the object having the smaller identifier (object A). That is, the pointer value given to object C becomes A, so that a pointer from object C to object A is depicted. Furthermore, at the timing of the end of step 5, object C and object B are linked, with object A being the termination.

In this manner, the route values at the timing of the end of the processing at the time counter t=n by the object linking section 44 are set as the route values at the start timing of the processing at the time counter t=n+1. Thereby, even when linked objects cannot be created by one time of processing, the respective objects can be linked, with the object having a small identifier employed as the termination object, as the time counter is incremented.

In the above-described example, at the time counter t=n, the acquired object pairs (B, C) and (A, C) are processed one time for each pair. This processing of the respective steps may be executed in parallel. Moreover, the object linking section 44 may repeatedly execute the processing described above about the acquired object pairs (B, C) and (A, C) at the time counter t=n. In this case, when the acquired object pair (B, C) is acquired after step 2, the route value of object B becomes A and the pointer value becomes C, which provides the same state as that at the end timing of step 5. In any case, every time updating the route value, the route value overwriting section 43 holds the updated route value. This can finally create linked objects in which the object having the smallest identifier is employed as the termination.

FIG. 11A is a diagram schematically depicting one example of linked objects linked by the object linking section 44. As depicted in FIG. 11A, the linked objects are composed of object A to object E and object A is the termination object. Furthermore, arrows point to contact-counterpart objects indicated by the pointer values given to the respective objects. That is, the pointer value of object A in FIG. 11A is A, the pointer value of object B is A, the pointer value of object C is B, the pointer value of object D is C, and the pointer value of object E is D.

Here, the same management ID is given to all objects configuring linked objects like those depicted in FIG. 11A and thereby these objects are subjected to group management. Thus, in order for all objects to be given the same management ID, the termination object is employed as the representative of the linked objects and the respective objects are set to all point to the termination object. That is, the pointer values of the respective objects configuring the linked objects are all set to the identifier of the termination object. This gives the identifier of the termination object to all objects, which allows group management, with the identifier of this termination object employed as the management ID.

Along with this, the pointer value updating section 45 updates the pointer values given to the respective objects to the pointer values of the contact-counterpart objects indicated by the pointer values of the respective objects. Specifically, when the pointer value updating section 45 updates the pointer values of the respective objects one time regarding the linked objects depicted in FIG. 11A, the pointer value of object C is updated to the pointer value of object B and thus becomes A. Furthermore, the pointer value of object D becomes B, which is the pointer value of object C, and the pointer value of object E becomes C, which is the pointer value of object D. In FIG. 11B, a diagram resulting from the update of the pointer values of the respective objects about the linked objects depicted in FIG. 11A is depicted. As depicted in FIG. 11B, the pointer values of all objects do not come to indicate the termination object through one time of update. Accordingly, the pointer value updating section 45 updates the pointer values of the respective objects again regarding the linked objects depicted in FIG. 11B. In FIG. 11C, a diagram resulting from the update of the pointer values of the respective objects about the linked objects depicted in FIG. 11B is depicted. As depicted in FIG. 11C, the pointer value of object D becomes A, which is the pointer value of object B, and the pointer value of object E becomes A, which is the pointer value of object C. FIG. 12 is a diagram depicting the transition of the pointer value of each object when the pointer value updating section 45 updates the pointer values of the respective objects regarding the linked objects depicted in FIG. 11A. As depicted also in FIG. 12, by the second round of update, the pointer values of all objects become values indicating the termination object (object A).

Although the case in which the number of objects is five is exemplified here, the pointer values of all objects can be set to indicate the termination object by similar processing even when the number of objects increases. Furthermore, with the update processing by the pointer value updating section 45, the pointer values of all objects can be updated through $\log_2 R$ times of processing if the number of objects is R, and the speed of the processing is higher than the case of tracing the route to the termination object from each object one by one.

In addition, in the update processing by the pointer value updating section 45, all objects are processed by the same algorithm of updating the pointer value to the pointer value of the object indicated by the pointer value. Thus, the pointer value updating section 45 can execute the processing of updating the pointer value in parallel about each of the objects configuring linked objects.

The invention claimed is:

1. An apparatus, comprising:
 a computer system operating to execute simulation to control objects in a virtual space for display on a display device, where the objects move with respect to one another within the virtual space;
 a collision detection section operating to affect controlling the simulation as a function of determine prospective collision between one or more of the objects at each of a plurality of determination timings about over a period of time, wherein the collision detection section includes:
 a complete binary tree creating section that, at each of the plurality of calculation timings, associates pieces of position information indicating positions of the objects in the virtual space at the calculation timing with leaves and creates a complete binary tree in which position information reflecting pieces of the position information of child nodes is associated with an internal node; and
 a node shuffling section that shuffles $2 \cdot 2^n$ ($n \geq 1$) child nodes regarding each group of $2^n$ nodes on a basis of the position information associated with each of the $2 \cdot 2^n$ child nodes belonging to the 2n nodes in each layer sequentially from an immediately-upper layer of a lowermost layer in the complete binary tree,
 wherein collision determination between objects is carried out by using the complete binary tree resulting from the shuffling by the node shuffling section,
 the position information indicating the position of the object is a region in which the object that corresponds is inscribed, and
 the node shuffling section shuffles the $2 \cdot 2^n$ child nodes belonging to the $2^n$ nodes into combinations with which the region of a parent node becomes reduced in size.

2. The apparatus according to claim 1, wherein, regarding each of a plurality of combination candidates obtained by shuffling the $2 \cdot 2^n$ child nodes, the node shuffling section randomly changes size of the region of a parent node with the combination candidate, and the node shuffling section shuffles the $2 \cdot 2^n$ child nodes belonging to the $2^n$ nodes to yield the combination candidate with which the region resulting from the change in the size is reduced in size.

3. The apparatus according to claim 2, further comprising a determining section that determines whether or not overlapping is present between the regions of nodes for each pair of two nodes in each layer sequentially from an uppermost layer in the complete binary tree resulting from the shuffling by the node shuffling section.

4. The apparatus according to claim 3, wherein the determining section further determines whether or not overlapping is present between the regions of nodes in all combinations of four child nodes belonging to two nodes about which it is determined that overlapping is present by the determining section in a previous layer.

5. The apparatus according to claim 1, wherein the complete binary tree creating section creates the complete binary tree by using a correspondence relationship between leaves and objects in a complete binary tree used for collision determination at a previous calculation timing in a case of creating a complete binary tree to be used for collision determination at a second or subsequent calculation timing.

6. A method, comprising:
 executing computer simulation to control objects in a virtual space for display on a display device, where the objects move with respect to one another within the virtual space;
 controlling the simulation as a function of determining prospective collision between one or more of the objects at each of a plurality of determination timings about over a period of time, wherein the determining includes:
 associating pieces of position information indicating positions of the objects in the virtual space at a certain determination timing with leaves and creating a complete binary tree in which position information reflecting pieces of the position information of child nodes is associated with an internal node; and
 shuffling $2 \cdot 2^n$ ($n \geq 1$) child nodes regarding each group of $2^n$ nodes on a basis of the position information associated with each of the $2 \cdot 2^n$ child nodes belonging to the $2^n$ nodes in each layer sequentially from an immediately-upper layer of a lowermost layer in the complete binary tree, wherein:
 the position information indicating the position of the object is a region in which the object that corresponds is inscribed, and
 the shuffling includes shuffling the $2 \cdot 2^n$ child nodes belonging to the $2^n$ nodes into combinations with which the region of a parent node becomes reduced in size.

7. A non-transitory, computer readable recording medium containing a program for causing a computer system to carry out actions, comprising:
 executing computer simulation to control objects in a virtual space for display on a display device, where the objects move with respect to one another within the virtual space;
 controlling the simulation as a function of determining prospective collision between one or more of the objects at each of a plurality of determination timings about over a period of time, wherein the determining includes:
 associating pieces of position information indicating positions of the objects in the virtual space at a certain determination timing with leaves and creating a complete binary tree in which position information reflecting pieces of the position information of child nodes is associated with an internal node; and
 shuffling $2 \cdot 2^n$ ($n \geq 1$) child nodes regarding each group of $2^n$ nodes on a basis of the position information associated with each of the $2 \cdot 2^n$ child nodes belonging to the $2^n$ nodes in each layer sequentially from an immediately-upper layer of a lowermost layer in the complete binary tree, wherein:
 the position information indicating the position of the object is a region in which the object that corresponds is inscribed, and the shuffling includes shuffling the $2 \cdot 2^n$ child nodes belonging to the $2^n$ nodes into combinations with which the region of a parent node becomes reduced in size.

\* \* \* \* \*